United States Patent [19]

Jambotkar

[11] 4,223,329

[45] Sep. 16, 1980

[54] BIPOLAR DUAL-CHANNEL CHARGE-COUPLED DEVICE

[75] Inventor: Chakrapani G. Jambotkar, Hopewell Junction, N.Y.

[73] Assignee: International Business Machines Corporation, Armonk, N.Y.

[21] Appl. No.: 920,935

[22] Filed: Jun. 30, 1978

[51] Int. Cl.³ ............... H01L 29/78; G11C 19/28; H01L 27/04
[52] U.S. Cl. ...................... 357/24; 357/50; 307/221 D
[58] Field of Search ............ 357/24; 307/221 D

[56] References Cited

U.S. PATENT DOCUMENTS

| | | | |
|---|---|---|---|
| 3,739,240 | 6/1973 | Krambeck | 357/24 |
| 3,784,847 | 1/1974 | Kurz et al. | 357/24 |
| 3,896,484 | 7/1975 | Nishizawa et al. | 357/24 |

FOREIGN PATENT DOCUMENTS

| | | | |
|---|---|---|---|
| 7606746 | 12/1976 | Netherlands | 357/24 |
| 535604 | 11/1976 | U.S.S.R. | 357/24 |

*Primary Examiner*—Gene M. Munson
*Attorney, Agent, or Firm*—Robert J. Haase

[57] ABSTRACT

A bipolar dual-channel charge-coupled device having a first channel at the surface for storing a first bit stream of minority charge carrier packets and a second channel buried in the bulk for storing a second bit stream of majority charge carrier packets. The two bit streams are transferred along their respective surface and buried channels simultaneously and independently of each other, thereby substantially increasing the bit storage density of the chip.

7 Claims, 4 Drawing Figures

BIPOLAR DUAL-CHANNEL CHARGE-COUPLED DEVICE

BACKGROUND OF THE INVENTION

1. Field of the Invention

This invention relates generally to charge-coupled devices and more particularly to a bipolar dual-channel charge-coupled device for the simultaneous storage of two independent bit streams of charge packets of opposite conductivity types.

2. Description of the Prior Art

Charge-coupled device (CCD) structures for use in data processing system storage and communication signal processing are well known in the art. Referring to the patents and publications listed below under the heading "References Cited By Applicant", Boyle and Smith [Refs. 1, 2, 3] originally disclosed the basic charge-coupled concept in the form of a surface channel device. Krambeck [Ref. 4] then disclosed the buried channel structure wherein the charge packets are within the bulk of the semiconductor rather than at the surface. Modifications of the buried channel arrangement were thereafter disclosed by Carnes and Kosonocky [Ref. 5], Erb [Ref. 6], Tasch [Ref. 7], Esser [Ref. 8] and Walden [Ref. 9].

The charge-coupled structure is a serial device and therefore its access time is much slower than a randomly accessed semiconductor device. However, the charge-coupled device has a higher bit density and simpler structure and therefore lower cost than the random access memory device, and therefore may have utility in mass storage applications where cost rather than speed is of primary importance. However, in these low-cost applications the charge-coupled device must compete on a cost basis with presently available techologies such as disk and tape storage, as well as proposed new technologies such as the bubble magnetic memory.

Therefore, if the charge-coupled device is to succeed in this competition of technolgies, it is vitally important that the cost per bit of information be reduced by every feasible means. Since for a given chip size and technology the cost of manufacture is approximately constant, one of the most effective ways of reducing the cost is to increase the chip density; that is, the number of bits of information stored per chip unit area.

Krambeck [Ref. 4] discloses an arrangement having dual buried channels parallel to and spaced from each other and buried within the semiconductor bulk so as to store two independent bit streams. If feasible, this arrangement would approximately double the bit density. In effect, this proposal appears to be an attempt to fabricate CCD registers on the front as well as the back side of the wafer, and thus obtain two registers in the same area. However, it is believed that the inherent disadvantages of this arrangement render it impractical so that it has not been put into production.

The prior art noted above, as well as all other prior integrated circuit devices of which the present inventor is aware, are divided by a rigid dichotomy of bipolar and MOS technologies. That is, the bipolar devices involve the flow of charge carriers of both conductivity types, whereas the MOS (metal-oxide-semiconductor) devices are unipolar and involve the flow of charge carriers of only one conductivity type. More particularly, all charge-coupled devices of the prior art of which the present inventor is aware embody the unipolar MOS technology.

SUMMARY OF THE INVENTION

The charge-coupled device structure in accordance with the present invention achieves almost double the bit density of the prior art by the heterodoxy of departing from the heretofore rigid separation of bipolar and MOS technologies. That is, the present charge-coupled device is bipolar rather than unipolar in that the current flow comprises the transportation of electrons as well as holes.

More particularly, in the preferred embodiment disclosed for purposes of illustration, a single charge-coupled device stores and transfers two separate independent serial bit streams of information. A first bit stream comprising a series of charge carrier packets of one conductivity type (e.g. electrons) flows along a first channel at the surface of the semiconductor. A second bit stream comprising a series of charge carrier packets of the opposite conductivity type (e.g. holes) flows in a second channel buried within the bulk of the semiconductor and spaced from the first bit stream at the surface of the semiconductor.

In the present invention each gate electrode forms at alternate clock phases two potential wells each trapping charge packets of the opposite conductivity type. More particularly, at one clock phase a first potential well under the gate electrode traps electrons adjacent the surface of the semiconductor, and then at the next clock phase a second potential well under the same gate electrode traps holes in a buried channel spaced inwardly within the interior bulk of the semiconductor. As a result, each gate electrode alternately forms two different charge storage sites for electrons and holes respectively.

Although the resulting bit density is not quite doubled due to the necessity for additional structure and circuitry to accommodate the extra channel, the bit density achieved by the bipolar charge-coupled device of the present invention is substantially increased as compared with unipolar devices of the prior art, and therefore the cost per bit of information is substantially reduced.

IN THE DRAWINGS

DETAILED DESCRIPTION

Figure 4:
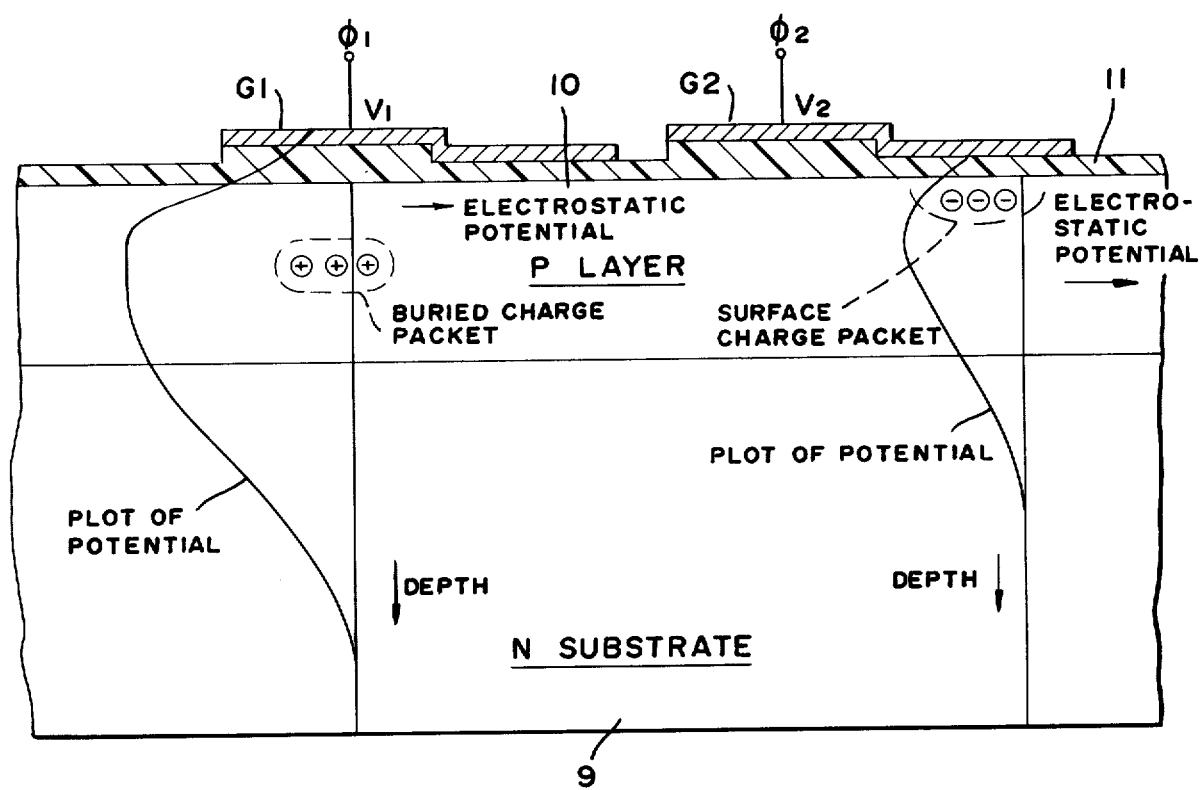
FIG. 4 is a schematic sectional view of the vertical geometry and showing a majority carrier charge packet stored within the buried potential well beneath a first gate electrode and a minority carrier charge packet stored within the surface potential well beneath a second gate electrode, together with plots of the respective electrostatic potentials provided by the two gate electrodes.

Referring to FIG. 4, the basic mode of operation of the present invention will first be described. An N-type substrate 9 is shown with a P-type diffusion layer 10 formed adjacent its upper surface. Superimposed over the latter is an insulating layer 11 of silicon dioxide separating the upper surface of the substrate 9 from a series of gate electrodes as indicated schematically at G1 and G2.

The P-type layer 10 is reverse-biased in the conventional manner so as to form a depletion region constituting a buried charge channel along which packets of holes may be stored and transferred in the manner well-known in the art. One such buried charge packet is indicated in FIG. 4 by the dashed lines enclosing the three "plus" symbols designating holes. This buried charge packet is shown as stored within a potential well buried within the interior bulk of the P-type layer 10 and located beneath the first electrode G1.

Located beneath the second electrode G2 and adjacent to the surface of the P-type layer 10 there is shown an electronic charge packet within a potential well indicated by the dashed lines enclosing three "minus" symbols depicting electrons.

The electrostatic potential provided by the $\phi 1$ clock voltage applied to gate electrode G1 is shown by a plot beneath that electrode, and similarly, the potential provided by the $\phi 2$ clock voltage applied to the gate electrode G2 is shown as a plot beneath the latter electrode. The abscissa of each of these potential plots extends downwardly as shown by the arrow and is marked "DEPTH" so as to indicate the distance from the surface of the substrate. The ordinate of each of these potential plots is shown by the arrow to extend to the right and is the respective electrostatic potential provided by each of the gate electrodes G1 and G2.

By properly time-sequenced clock phase voltages applied to the gates such as G1 and G2, the buried charge potential wells along with the charge packets of holes stored therein may be shifted along the buried charge channel from site to site so as to form a continuous serial stream of data bits flowing from left to right as viewed in the drawings, while simultaneously the surface charge potential wells with the electron charge packets stored therein may be transferred serially from site to site along the surface of the P-type layer 10 so as to provide a second serial data bit stream flowing from right to left. This simultaneous flow of two separate and independent data bit streams enables the bit density of the charge-coupled device of the present invention to be almost doubled as compared with equivalent devices of the prior art. The structural details of a preferred embodiment realizing this novel mode of operation are described below.

Figure 1:
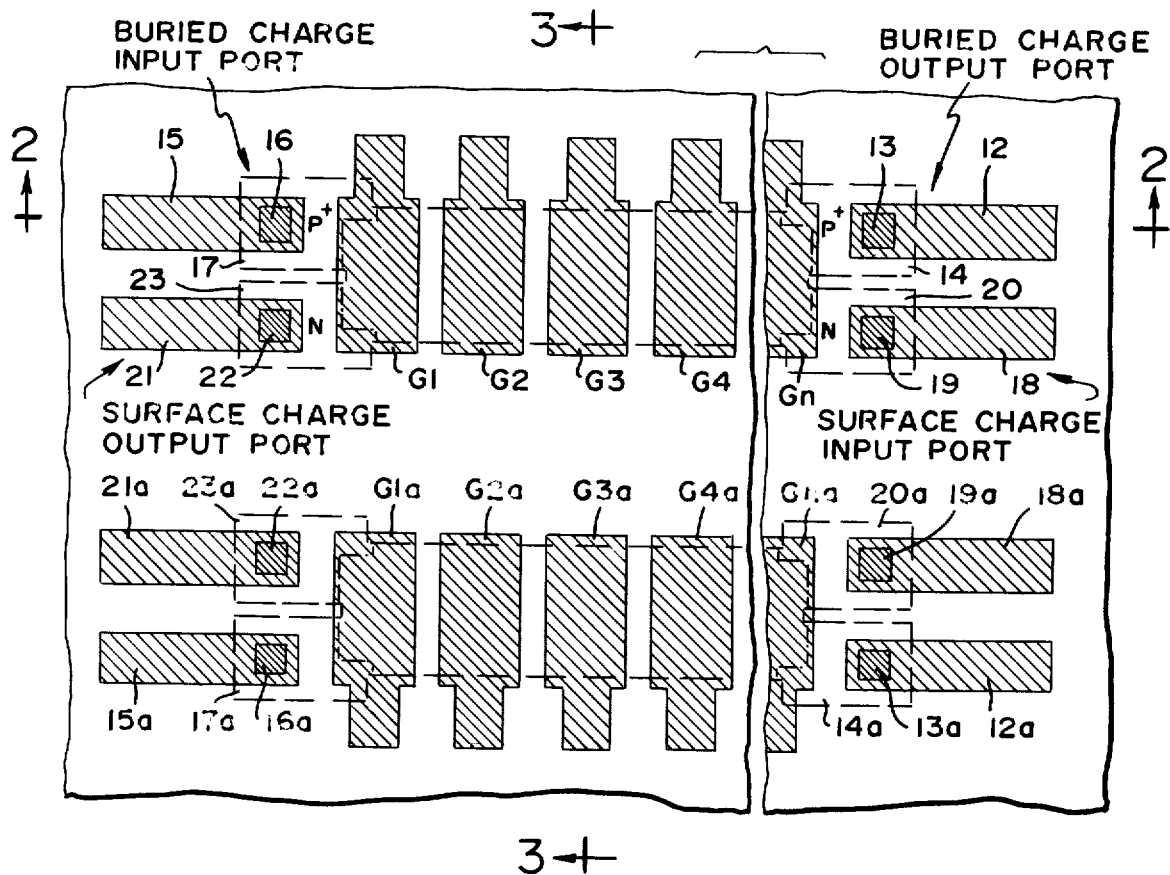
FIG. 1 is a sectional plan view, partially broken away, of a charge-coupled device in accordance with the present invention and showing two adjacent serial shift registers or channels.
Figure 2:
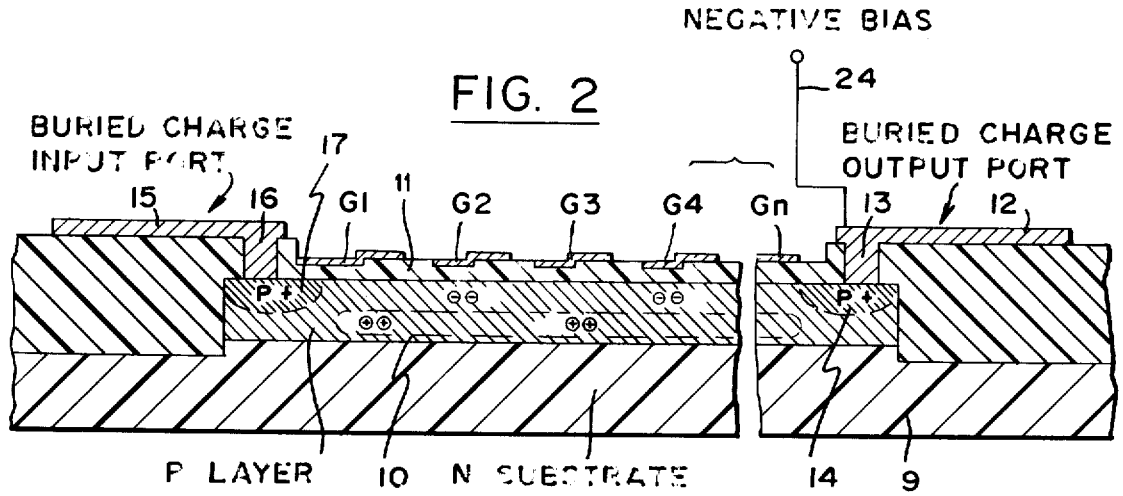
FIG. 2 is a longitudinal sectional view through the upper channel of FIG. 1 and taken substantially on the line 2—2 in the latter figure.
Figure 3:
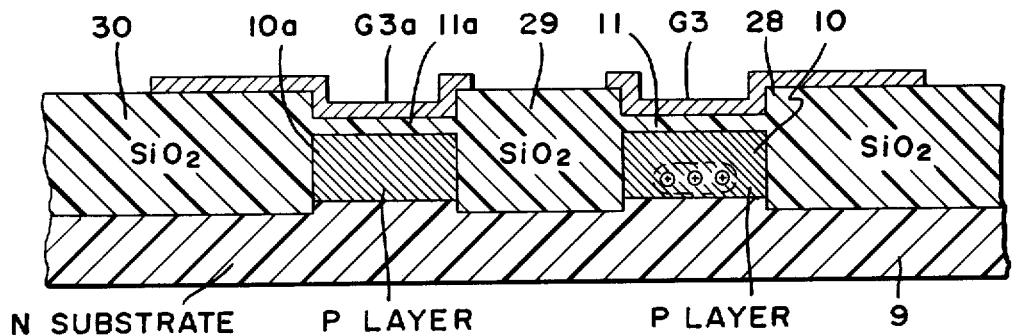
FIG. 3 is a transverse sectional view through both channels shown in FIG. 1 and is taken substantially on the line 3—3 of the latter figure.

Referring now to FIGS. 1 to 3 inclusive, there is shown a preferred embodiment of the invention for the purpose of illustrating one of the many forms which the invention may take in practice. These figures show a portion of an integrated circuit shift register configuration including two adjacent serial channels each constituting a serial shift register section. However, it will be understood that the invention may be readily embodied in parallel sections such as in a serial-parallel-serial memory configuration.

One of the serial shift register sections is shown in the upper portion of FIG. 1 and will be described in detail. The other shift serial register section is an identical mirror image of the first register section and is shown in the lower portion of FIG. 1. The corresponding elements of the two registers have applied thereto the same reference designations with those referring to the second register also having the suffix "a" appended.

Both shift registers are formed in the substrate 9 of N-type semiconductor material which has formed therein adjacent its upper surface the diffusion layer 10 of P-type semiconductor material. Extending over the upper surface of the substrate 9 and layer 10 is the usual dielectric insulating film 11 of silicon dioxide. Superimposed upon the latter and arranged in serial contiguous relation are the gate electrodes G1, G2, G3, G4, Gn.

At the right-hand end of each shift register is a buried charge output port serving as the drain for the hole charge packets. This port comprises a metal contact 12 having a portion 13 projecting downwardly through the insulating silicon dioxide film 11 and in conductive contact with a diffusion region 14 of P+-type and embedded within the P-type layer 10.

At the opposite left-hand end of each shift register is a buried charge input port which serves as a source for the hole charge packets. This port comprises a metal contact 15 having a portion 16 projecting downwardly through the insulating silicon dioxide film 11 so as to conductively contact a P+-type region 17 formed within the P-type layer 10.

At the right-hand end of each shift register there is a surface charge input port serving as the source for the electronic charge packets. This input port comprises a contact 18 having a portion 19 projecting downwardly through the silicon dioxide film 11 in a manner similar to the construction of contact 12 and portion 13. However, the portion 19 of contact 18 extends to a diffusion region 20 which differs from region 14 in that region 20 is N-type and is formed within the P-type layer 10 adjacent the P+-type region 14 as shown in FIG. 3.

The left-hand end of each shift register is provided with a surface charge output port which serves as a drain for the electronic charge packets. This output port is similar in construction to the surface charge input port and comprises a contact 21 having a portion 22 projecting downwardly through the silicon dioxide film 11 so as to make conductive contact with an N-type region 23 diffused within the P-type layer 10 and adjacent to the P+-type region 17.

Referring to FIG. 3, it will be seen that the silicon dioxide film 11 is provided with downwardly extending recessed portions 28, 29, 30 which serve two important functions. First, these portions prevent the electronic charge at the surface of P-type layer 10 from escaping to the N-type substrate 9 which is biased at the most positive voltage. Second, the recessed portions of the silicon dioxide film 11 serve to isolate the adjacent channels which in the preferred embodiment are disclosed as adjacent serial shift register sections. More specifically, the recessed silicon dioxide extension 29 is shown extending between the channel of the first serial shift register section and the adjacent channel of the second serial shift register section so as to isolate the two adjacent channels from each other.

In order to provide a buried channel within P-type layer 10 the latter must be depleted. This is achieved in the conventional manner by the application of a negative bias at 24 to contact 12 of the buried charge output port.

The operation of the structure shown in FIGS. 1 to 3 will be apparent from the above description of the invention with respect to FIG. 4 and therefore will be stated here only summarily. A first serial data bit stream enters a serial shift register section at the surface charge input port 18, 19, 20 and flows as a series of electronic charge packets from right to left, as viewed in the drawings, along the surface of P-type layer 10. These electronic charge packets are transferred from site to site as appropriate clock phase voltages are applied in timed sequence to gate electrodes G1, G2, G3, G4, Gn in the conventional manner well-known in the art. The serial stream of surface electronic charge packets is then output from the shift register section at the surface charge output port 21, 22, 23.

Simultaneously with the flow of the electronic charge packets along the surface of P-type layer 10, a second data bit serial stream flows in the opposite direction from left to right as viewed in the drawing. This second data bit serial stream is in the form of buried hole charge packets. The stream enters the serial shift register section at buried charged input port 15, 16, 17 and the resulting hole charge packets flow serially from site to site along the buried charge depletion region formed within the bulk interior of P-type layer 10. The serial stream of hole charge packets is then output from the serial shift register section at buried charge output port 12, 13, 14.

While the invention has been shown and particularly described with reference to a preferred embodiment, it will be understood by those skilled in the art that various changes in form and detail may be made therein without departing from the scope of the invention as delineated in the appended claims.

References Cited By Applicant

1. Boyle, W. S. and Smith, G. E., "Charge Coupled Semiconductor Devices," Bell Sys. Tech. J. (April 1970) pp. 587–593.
2. Boyle, W. S. and Smith, G. E., U.S. Pat. No. 3,858,232; issued Dec. 31, 1974; filed Nov. 9, 1971.
3. Smith, G. E., U.S. Pat. No. 3,761,744; issued Sept. 25, 1973; filed Dec. 2, 1971.
4. Krambeck, R. H., U.S. Pat. No. 3,739,240; issued June 12, 1973; filed Apr. 6, 1971.
5. Carnes, J. E. and Kosonocky, W. F., "Charge-Coupled Devices and Applications," Solid State Technology, (April 1974) pp. 67–77.
6. Erb, D. M., U.S. Pat. No. 3,913,077; issued Oct. 14, 1975; filed Apr. 17, 1974.
7. Tasch, A. F., Jr., U.S. Pat. No. 4,024,563; issued May 17, 1977; filed Sept. 2, 1975.
8. Esser, L. J. M., U.S. Pat. No. 3,965,481; issued June 22, 1976; filed Nov. 22, 1974.
9. Walden, R. H., Krambeck, Strain, R. J., McKenna, J., Schryer, N. L. and Smith, G. E., "The Buried Channel Charge Coupled Device," Bell Sys. Tech. J. (September 1972) pp. 1635–1640.

What is claimed is:

1. A bipolar charge-coupled device structure comprising a semiconductor body, said body comprising a semiconductor layer of a first conductivity type having adjacent the surface thereof a series of electrodes, means for electrically biasing said semiconductor layer at a potential to form a depletion region extending longitudinally within the semiconductor layer near the surface thereof, means for applying voltages to the electrodes to provide adjacent each of a first plurality of said electrodes a respective first potential well at the surface of the semiconductor layer and forming a surface charge storage site for a charge packet of minority carriers of said semiconductor layer, and also adjacent each of a second plurality of said electrodes a second potential well buried within said depletion region and forming a buried charge storage site for a charge packet of majority carriers of said semiconductor layer, minority carrier input means for serially transmitting charge packets of minority carriers to a first surface charge storage site adjacent one of said electrodes, majority carrier input means for serially transmitting charge packets of majority carriers to a first buried charge storage site adjacent another of said electrodes, minority carrier output means for serially transmitting from the device structure a first series of electrical output signals corresponding to a series of minority carrier charge packets transferred to said output means, majority carrier output means for serially transmitting from the device structure a second series of electrical output signals corresponding to a series of majority carrier charge packets transferred to said last-recited output means, and control clocking means for varying the voltages applied to the electrodes in timed sequence so as to displace said potential wells and the respective charge packets therein in a first serial stream along said surface from said first surface charge storage site to said minority carrier output means and also in a second serial stream buried within said depletion region from said first buried charge storage site to said majority carrier output means.

2. A bipolar charge-coupled device structure as recited in claim 1 wherein said semiconductor body further comprises a semiconductor substrate of a second conductivity type having formed therein said layer of said first conductivity type adjacent the surface of said substrate.

3. A bipolar charge-coupled device structure as recited in claim 2 and comprising isolation means extending from the semiconductor body surface and defining said semiconductive layer to form thereof an isolated channel for said charge storage sites.

4. A bipolar charge-coupled device structure as recited in claim 3 wherein said minority carrier input means includes a region of said second conductivity type within said layer and adjacent one end of said channel, said minority carrier output means including a region of said second conductivity type within said layer and adjacent the opposite end of said channel, said majority carrier input means including a region of said first conductivity type within said layer and adjacent said opposite end of said channel and having a concentration of impurity of said first conductivity type higher than said layer, and said majority carrier output means including a region of said first conductivity type within said layer and adjacent said first end of said channel and having a concentration of impurity of said first conductivity type higher than said layer.

5. A bipolar charge-coupled device structure as recited in claim 4 and comprising an insulating layer of non-conductive material extending over the surfaces of said substrate and said semiconductive layer, said insulating layer having portions thereof recessed into said semiconductor body and forming isolation boundaries defining said channel.

6. A bipolar charge-coupled device as recited in claim 5 wherein
said non-conductive material of said insulating layer comprises silicon dioxide.

7. A bipolar charge-coupled device as recited in claim 6 and comprising
a plurality of conductive contacts each extending from the surface of the structure through said insulating layer to a respective one of said regions of said input means and said output means.

* * * * *